(12) United States Patent  
Yamaguchi et al.

(10) Patent No.: US 7,361,607 B2  
(45) Date of Patent: *Apr. 22, 2008

(54) METHOD FOR MULTI-LAYER RESIST PLASMA ETCH

(75) Inventors: Yoko Yamaguchi, Fremont, CA (US); Chris Lee, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/562,929

(22) Filed: Nov. 22, 2006

(65) Prior Publication Data

US 2008/0038927 A1    Feb. 14, 2008

Related U.S. Application Data

(63) Continuation-in-part of application No. 10/882,842, filed on Jun. 30, 2004, now Pat. No. 7,141,505, which is a continuation-in-part of application No. 10/607,612, filed on Jun. 27, 2003, now Pat. No. 7,186,661.

(51) Int. Cl.  
*H01L 21/302* (2006.01)

(52) U.S. Cl. ............ 438/709; 438/725; 438/736; 216/58; 216/67

(58) Field of Classification Search ............ 438/709, 438/725, 736; 216/58, 72  
See application file for complete search history.

(56) References Cited

U.S. PATENT DOCUMENTS

| 5,145,554 | A * | 9/1992 | Seki et al. ............ 438/712 |
| 6,255,022 | B1 * | 7/2001 | Young et al. ............ 430/5 |
| 6,329,109 | B1 * | 12/2001 | Figura et al. ............ 430/11 |
| 7,141,505 | B2 * | 11/2006 | Nguyen et al. ............ 438/709 |
| 2001/0046632 | A1 * | 11/2001 | Young et al. ............ 430/5 |
| 2002/0003126 | A1 * | 1/2002 | Kumar et al. ............ 216/67 |
| 2004/0129361 | A1 * | 7/2004 | Chen et al. ............ 156/58 |

* cited by examiner

*Primary Examiner*—Binh X. Tran  
(74) *Attorney, Agent, or Firm*—Martine Penilla & Gencarella, LLP

(57) ABSTRACT

A method for etching a multi-layer resist defined over a substrate in a plasma etch chamber is provided. The method initiates with introducing the substrate having a pattern defined on a first layer of the multi-layer resist into the etch chamber. $SO_2$ gas flows into the etch chamber and a plasma is struck in the etch chamber while flowing the $SO_2$ gas. The multi-layer resist is then etched.

19 Claims, 14 Drawing Sheets

METHOD FOR MULTI-LAYER RESIST PLASMA ETCH

CROSS REFERENCE TO RELATED APPLICATION

This application is a continuation-in-part of application Ser. No. 10/882,842, now U.S. Pat. No. 7,141,505, filed on Jun. 30, 2004, which is a continuation-in-part of application Ser. No. 10/607,612, now U.S. Pat. No. 7,186,661, filed on Jun. 27, 2003. The disclosure of this application is incorporated herein by reference for all purposes.

BACKGROUND OF THE INVENTION

The present invention relates to an improved method for plasma etching a multi-layer resist in the fabrication of semiconductor devices.

The performance of today's integrated circuit chips is related to the dimensions of the transistors and wiring interconnects in the integrated circuits. As the dimensions of the transistors and wiring interconnects continue to shrink, the ability to pattern smaller features using photolithography has been a primary factor driving the success of the integrated circuit industry.

Photolithography processes involve the use of lithography imaging tools and photoresist materials. The minimum resolution achievable with the lithography imaging is governed by the minimum resolution for an exposure wavelength and a resolving power or numerical aperture of a lens system used by the lithography imaging tool. A shorter exposure wavelength for a larger numerical aperture often results in high resolution in order to print smaller patterns in a resist film. However, decreasing the wavelength or increasing the numerical aperture often results in a decrease in the depth of focus (DOF), thereby requiring the reduction and the thickness of the photoresist film.

Simply reducing the thickness of the resist film to enhance resolution is effective up to a certain point. This point is reached when the resist becomes too thin to withstand subsequent etching processes that transfer the resist pattern to one or more layers under the resist film. In order to overcome these problems, bi-layer resists have been developed to extend the photolithography technology. A bilayer resist film typically includes a relatively thick lower resist layer (also referred to as a masking or planarizing layer) disposed over a wafer or substrate, and a relatively thin upper resist layer, or imaging layer, disposed on top of the lower resist layer. The upper resist layer is patterned by light exposure and subsequently developed. The resulting upper layer pattern is used as a mask for etching the lower resist layer. In this way, a resist pattern with high aspect ratio can be formed in the bilayer resist film.

In order to provide sufficient etch resistance to the upper resist layer when the bilayer resist undergoes a lower resist layer etching process, silicon is typically incorporated into the upper resist layer. Since the lower resist layer is typically made of organic polymers, an oxygen-based plasma is usually used to etch the lower resist layer, using the patterned top resist layer as a mask. Thus, while the lower resist layer is being etched in the oxygen based plasma, silicon precursors in the upper resist layer are oxidized to form a refractory oxide during the etching processes. The refractory oxide acts as an etch barrier, resulting in enhanced etching resistance of the upper resist layer. The enhancement achieved in this manner, however, is found in many applications to be insufficient.

The lower resist etching process not only requires good etch contrast between the upper resist layer and the lower resist layer, but also needs to be anisotropic to achieve good critical dimension (CD) control. With pure oxygen plasma, however, anisotropic etching can only be achieved when the temperature of the resist layers is maintained at or below about −100° C. during the etching process. Otherwise, lateral etching or undercutting is usually observed indicating CD loss. Multi-layer resists are available that include more than two layers and some of the problems mentioned above are prevalent.

In view of the foregoing, there is a need for a method and apparatus to provide alternative anisotropic etching conditions when etching a multi-layer resist.

SUMMARY OF THE INVENTION

Broadly speaking, the present invention fills these needs by introducing a scheme for providing anisotropic etching conditions for etching a multi-layer resist. It should be appreciated that the present invention can be implemented in numerous ways, including as a process, or a method. Several inventive embodiments of the present invention are described below.

A method for etching a multi-layer resist defined over a substrate in a plasma etch chamber is provided. The method initiates with introducing the substrate having a pattern defined on a first layer of the multi-layer resist into the etch chamber. $SO_2$ gas flows into the etch chamber and a plasma is struck in the etch chamber while flowing the $SO_2$ gas. The multi-layer resist is then etched.

A method for controlling critical dimension bias during a multi-layer resist etch in an etch chamber is provided. The method initiates with striking an oxygen based plasma in a chamber while flowing $SO_2$ gas into the chamber. The plasma density is maintained between about $1\times10^9/cm^3$ and about $1\times10^{12}/cm^3$. Each layer of the multi-layer resist is then etched.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIG. 2 is a schematic illustration of a shallow trench etching process wherein the photoresist and BARC layers have been removed and the silicon nitride and pad oxide layers have been etched through.

DETAILED DESCRIPTION OF THE PREFERRED EMBODIMENTS

Figure 1:
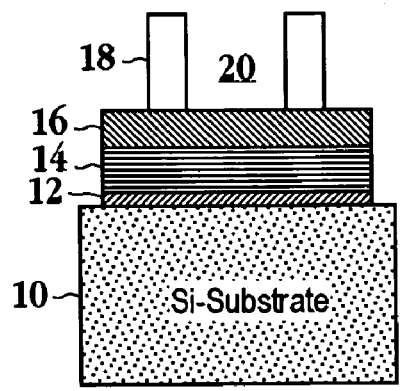
FIG. 1 is a schematic illustration of a stack of layers on a silicon substrate prior to forming a shallow trench isolation feature.

Several exemplary embodiments of the invention will now be described in detail with reference to the accompanying drawings. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention. FIGS. 1-11 discuss the use of silicon for shallow trench isolation etch applications and gate etching applications. FIGS. 12-15 discuss embodiments directed to the use of $SiCl_4$ for etching bilayer photoresists, while FIGS. 16A-18 describe embodiments directed to the use of $SiCl_4$ and $SO_2$ for etching multi-layer resists, i.e., two or more resist layers.

Many plasma etch applications rely on the generation of a passivation layer to obtain the desired feature profile. The primary mechanism for profile control involves the balance of etch and deposition reactions. The etch reactions are generally directly controlled by the reaction chamber parameters such as input power, pressure, and gas flows. In plasma etching of silicon wafers, etch reaction products are the primary deposition source with the result that deposition mechanisms are indirectly controlled.

For shallow trench and gate applications, various etch gas chemistries are used. For example, when using $HBr$—$O_2$ etch gas chemistries, the passivation layer is primarily made up of $Si_xBr_yO_z$. For $Cl_2$—$O_2$ etch gas chemistries, the passivation layer is primarily made of $Si_xCl_yO_z$. Other constituents of the passivation layer can include N, C, H and F. Moreover, as a result of etching of silicon wafer and/or chamber materials such as quartz components, volatile silicon etch byproducts are incorporated into the passivation layer.

As explained above, silicon can be incorporated in passivation layers due to etching of silicon sources such as silicon wafers and/or chamber materials. Such silicon sources are secondary products that are not directly controlled by the etch gas chemistry. Moreover, as the volatile silicon etch byproducts are transported from the wafer surface toward the vacuum evacuation port, there is a finite possibility of deposition of the silicon-containing byproducts on the wafer surface. This can lead to non-uniform silicon byproduct concentration across the wafer and lead to non-uniformity of the etched feature profile and critical dimension.

The plasma may be produced in various types of plasma reactors. Such plasma reactors typically have energy sources which use RF energy, microwave energy, magnetic fields, etc. to produce a medium to high density plasma. For instance, a high density plasma could be produced in a transformer coupled plasma (TCP™) available from Lam Research Corporation which is also called inductively coupled plasma reactor, an electron-cyclotron resonance (ECR) plasma reactor, a helicon plasma reactor, or the like. An example of a high flow plasma reactor which can provide a high density plasma is disclosed in commonly owned U.S. Pat. No. 5,820,261 the disclosure of which is hereby incorporated by reference. The plasma can also be produced in a parallel plate etch reactor such as the dual frequency plasma etch reactor described in commonly owned U.S. Pat. No. 6,090,304, the disclosure of which is hereby incorporated by reference.

The process may be carried out in an inductively coupled plasma reactor maintained at a desired vacuum pressure by a vacuum pump connected to an outlet in a wall of the reactor. Etching gas can be supplied to a showerhead or injector arrangement by supplying gas from a gas supply to a plenum extending around the underside of a dielectric window. A high density plasma can be generated in the reactor by supplying RF energy from an RF source to an external RF antenna such as a planar spiral coil having one or more turns outside the dielectric window on top of the reactor. The plasma generating source can be part of a modular mounting arrangement removably mounted in a vacuum tight manner on the upper end of the reactor.

A wafer may be supported within the reactor on a substrate support such as a cantilever chuck arrangement removably supported by a modular mounting arrangement from a sidewall of the reactor. Such a substrate support is at one end of a support arm mounted in a cantilever fashion such that the entire substrate support/support arm assembly can be removed from the reactor by passing the assembly through an opening in the sidewall of the reactor. The substrate support may include a chucking apparatus such as an electrostatic chuck (ESC) and the substrate can be surrounded by a dielectric focus ring. The chuck may include an RF biasing electrode for applying an RF bias to the substrate during an etching process. The etching gas supplied by a gas supply may flow through channels between the window and an underlying gas distribution plate (GDP) and enter the interior of the chamber through gas outlets in the GDP. The reactor may also include a heated liner extending from the GDP.

The process may also be carried out in a parallel plate plasma reactor which includes an interior maintained at a desired vacuum pressure by a vacuum pump connected to an outlet in a wall of the reactor. Etching gas can be supplied to a showerhead electrode by supplying gas from a gas supply and a medium density plasma may be generated in the reactor by supplying RF energy from one or more RF sources to the showerhead electrode and/or a bottom electrode. Alternatively, the showerhead electrode may be electrically grounded and RF energy at two different frequencies can be supplied to the bottom electrode.

It will be apparent to those skilled in the an that the flow rates of the various gases will depend on factors such as the type of plasma reactor, the power settings, the vacuum pressure in the reactor, the dissociation rate for the plasma source, etc.

The reactor pressure is preferably maintained at a level suitable for sustaining a plasma in the reactor. In general, too low a reactor pressure may lead to plasma extinguishment, whereas in a high density etch reactor too high a reactor pressure can lead to the etch stop problem. For high density plasma reactors, the reactor is preferably at a pressure below 100 mTorr.

The substrate support supporting the semiconductor substrate undergoing etching preferably cools the substrate enough to prevent deleterious side reactions such as burning of any photoresist on the substrate and formation of undesirable reactant gas radicals. In high and medium high density plasma reactors, it is sufficient to cool the substrate support to a temperature of −10 to +80° C. The substrate support may include a bottom electrode for supplying an RF bias to the substrate during processing thereof and an ESC for clamping the substrate. For example, the substrate can comprise a silicon wafer which is electrostatically clamped and cooled by supplying helium (He) at a desired pressure between the wafer and top surface of the ESC. In order to maintain the wafer at a desired temperature, the He may be maintained at a pressure of 11 to 30 Torr in the space between the wafer and the chuck.

Figure 2:
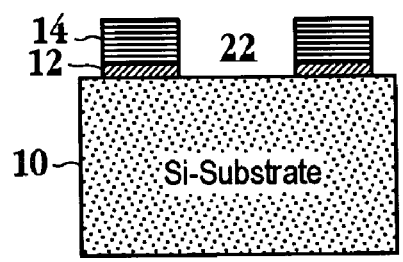
Figure 3:
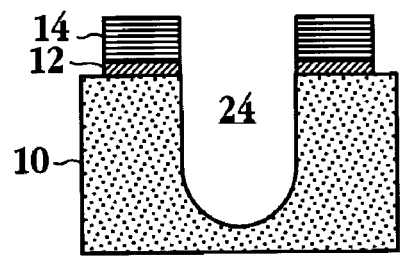
FIG. 3 is a schematic illustration of a shallow trench isolation feature etched into a silicon substrate.

FIGS. 1-3 show schematic representations of how a shallow trench may be etched into a silicon layer. As shown in FIG. 1, a silicon substrate 10 includes a stack of layers thereon including a 100 Å pad oxide 12, a 1500 Å thick layer of silicon nitride 14, a 600 Å thick bottom antireflective coating (BARC) 16, and a 3200 Å thick layer of photoresist 18 which has been previously patterned to provide an opening 20. In etching shallow trenches on a silicon wafer, the photoresist 18 will include many openings 20 corresponding to the desired trench locations. The silicon nitride layer 14 is opened at the locations of the openings 20 to form a patterned hard mask.

In opening the hard mask 14, the BARC layer 16 is opened with a plasma etch. In an exemplary BARC open step, the chamber can be at a vacuum pressure of 5 mTorr and the antenna used to inductively couple radio frequency energy into the chamber can be set at 350 watts. The substrate support may include an electrode which provides an RF bias by powering the electrode with 88 watts. The BARC may be opened using a plasma etch with 50 sccm $CF_4$ for 60 seconds while maintaining the temperature of the wafer at about 60° C. Next, the silicon nitride layer 14 and pad oxide 12 are opened to form openings 22 with the chamber set at the same pressure but raising the antenna power to 1000 watts. The silicon nitride layer can be etched with 70 sccm $CHF_3$ and 300 sccm Ar for 44 seconds while maintaining the wafer temperature at about 60° C. After that, the photoresist and BARC are stripped using a chamber pressure of 10 mTorr and 1000 watts to the antenna. The photoresist may be stripped using 200 sccm $O_2$ for 45 seconds.

As a result of the strip step, the BARC and photoresist layer have been removed and areas of exposed silicon have become oxidized from the $O_2$ plasma. In an exemplary process, the chamber is set at 5 mTorr and 350 watts power is supplied to the antenna. The oxidized silicon is etched using 50 sccm $CF_4$ for 7 seconds while maintaining the wafer temperature at about 60° C. Next, the silicon substrate may be etched with the chamber pressure set at 50 mTorr and 1000 watts power being supplied to the antenna. The bottom electrode may be supplied about 220 watts power and the etch gas can include 125 sccm $Cl_2$, 14 sccm $O_2$ and 14 sccm $N_2$ while maintaining the wafer temperature at about 60° C. In order to provide desired rounding and/or profile and/or CD control, a silicon containing gas such as $SiCl_4$ can also be added to the etch gas. After forming the trench structure 24 as shown in FIG. 3, the wafer can be cleaned using a 2 minute HF dip followed by a deionized water spin rinse.

Figure 4:
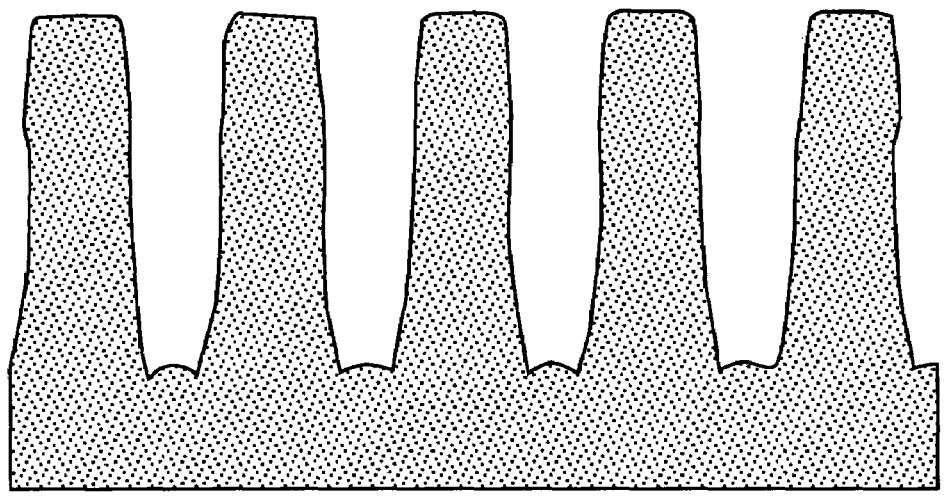
FIG. 4 is a photomicrograph of shallow trench isolation features having a bowed profile and subtrenched bottom.
Figure 5:
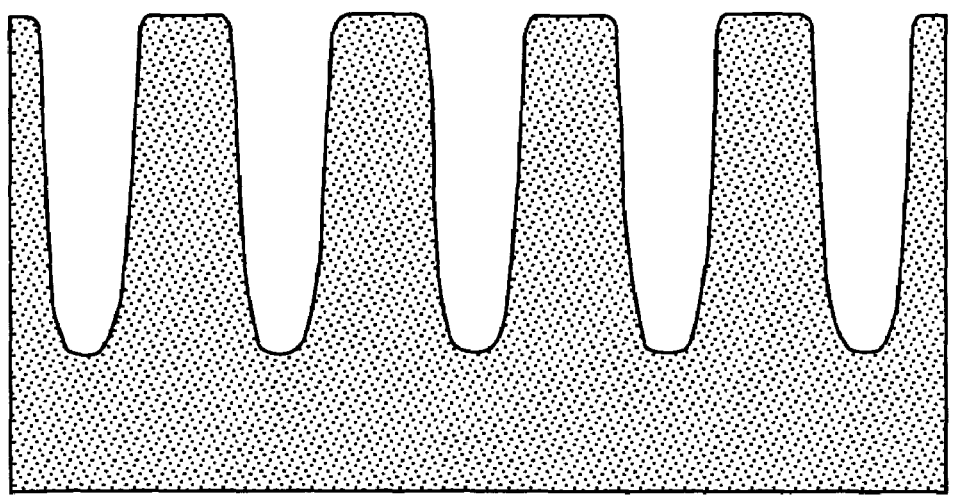
FIG. 5 is a photomicrograph of shallow trench isolation features etched with a silicon-containing gas.
Figure 6:
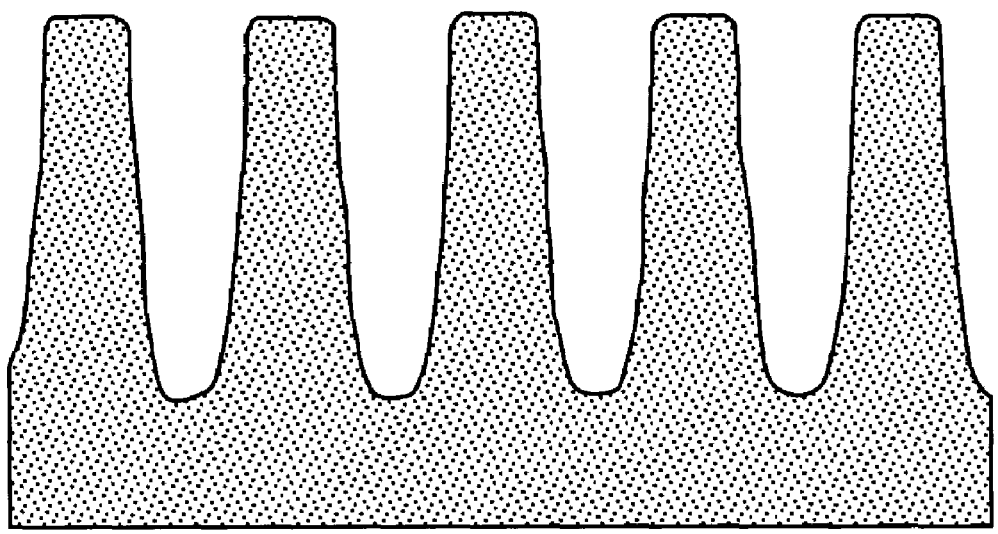
FIG. 6 is a photomicrograph of shallow trench isolation features which include top and bottom rounding.

FIG. 4 is a photomicrograph of a trench structure formed using 125 sccm $Cl_2$ and no $SiCl_4$ addition to the etch gas. As shown in FIG. 4, the trenches have a bowed profile and subtrenched bottoms. Improved critical dimension (CD) and profile control can be obtained by adding a silicon-containing gas to the etch gas. FIG. 5 is a photomicrograph of a trench structure formed when a silicon-containing gas is used during the shallow trench etch. The trench structure shown in FIG. 5 was etched with 75 sccm $Cl_2$ and 25 sccm $SiCl_4$ FIG. 6 is a photomicrograph of tapered trenches having rounded tops and bottoms as a result of using a silicon-containing gas during the shallow trench etch.

Figure 7:
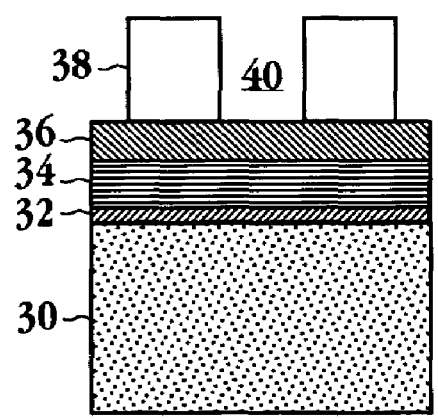
FIG. 7 is a schematic of a silicon substrate having a stack of layers thereon prior to carrying out a gate etch.
Figure 8:
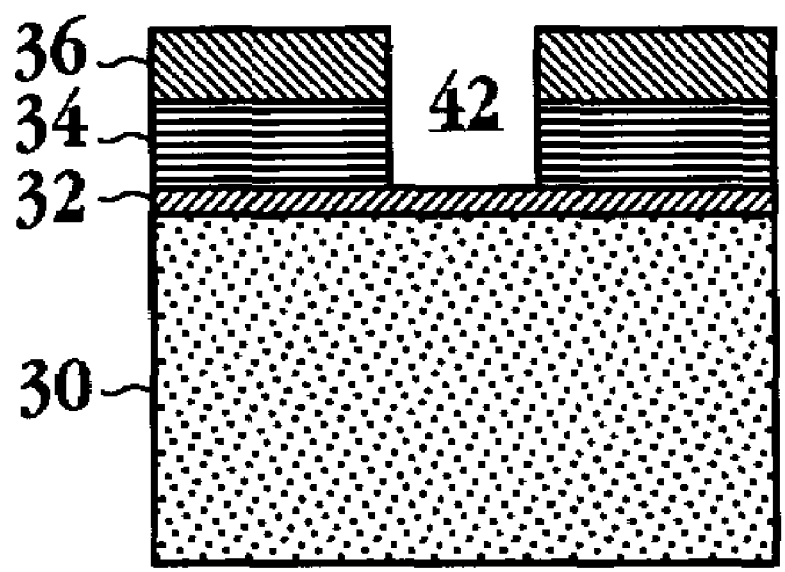
FIG. 8 is a schematic illustration of a silicon substrate having silicon nitride and polysilicon layers thereon etched through to a gate oxide.

FIGS. 7 and 8 are schematics representative of a gate etch. As shown in FIG. 7, a silicon wafer 30 includes a stack of layers thereon which includes a 15 Å thick layer of oxide 32, a 1500 Å thick layer of polysilicon 34, a 200 Å thick layer of silicon nitride 36, and a 2000 Å thick layer of photoresist 38, which has been patterned to include openings 40 therein corresponding to the locations of the gate etch. It should be appreciated that the barrier layer is not limited to silicon nitride. For example, one skilled in the art will appreciate that the hardmask in gate application is silicon dioxide ($SiO_2$) or silicon oxynitride ($SiO_xN_y$). In addition, the thickness of the barrier layer may be 300 Å, or any other suitable thickness. While a single opening 40 is shown in FIG. 7, in etching gate structures on a wafer there will be many openings 40 corresponding to the desired locations of the gates.

An exemplary process of a gate etch is as follows. Initially, a trimming step is carried out with the chamber pressure set at 15 mTorr and the antenna power set at 400 watts. The etch gas for the trimming step can include 30 sccm HBr and 10 sccm $O_2$. Then, the silicon nitride layer 36 is etched with the chamber set at 10 sccm $CF_4$ to provide an opening in the silicon nitride layer 36 corresponding to the opening 40. Then, the polysilicon is etched in four steps which includes a breakthrough step, a first main etch, a second main etch and an over etch. In the breakthrough step, the native oxide present at the surface of the silicon is etched because some chemistries, e.g., HBr, do not etch the $SiO_2$ easily or uniformly. It will be apparent to one skilled in the art that where the chemistry contains $CF_4$, the use of a breakthrough step is not necessary. In the first main etch, the chamber is set at 10 mTorr and the antenna is set at 800 watts power. The etch gas includes 50 sccm $Cl_2$, 175 sccm HBr, 60 sccm $Cf_4$ and 5 sccm $O_2$. In the second main etch, the chamber is set at 30 mTorr and the antenna is set at 350 watts. The etch gas for the second main etch includes 300 sccm HBr and 3 sccm $O_2$. In the over etch, the chamber is set at 80 mTorr and the antenna is supplied 500 watts power. The etch gas in the over etch includes 130 sccm HBr, 4 sccm $O_2$ and about 270 sccm He. A silicon containing gas such as $SiCl_4$ can be added to the first or second main etch and/or the over etch to improve gate profile control and within wafer CD control. After the polysilicon etch, an opening 42 extends to the gate oxide 32, as shown in FIG. 8.

Figure 9A:
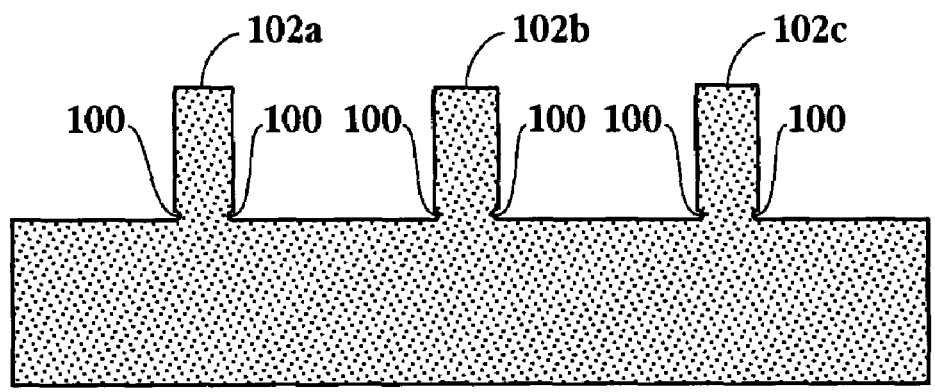
FIG. 9A is a simplified schematic diagram of an etch profile without the use of a silicon containing gas in the etching gas mixture during the over etch step.

FIG. 9A is a simplified schematic diagram of an etch profile without the use of a silicon containing gas in the etching gas mixture during the over etch step. Etched gate feature 102a through 102c include notches 100 at the base of each of the etch-gate features. As preserving the gate integrity at the end of the etch process when polysilicon stringers are removed, i.e., during the over-etch step, high selectivity to the oxide needs to be maintained while performing the over-etch step. As is generally known, gate oxide pitting is a phenomenon by which the gate oxide, or the gate material, is etched selectively in small localized areas resulting in etching of the silicon underneath, thereby creating pits.

Figure 9B:
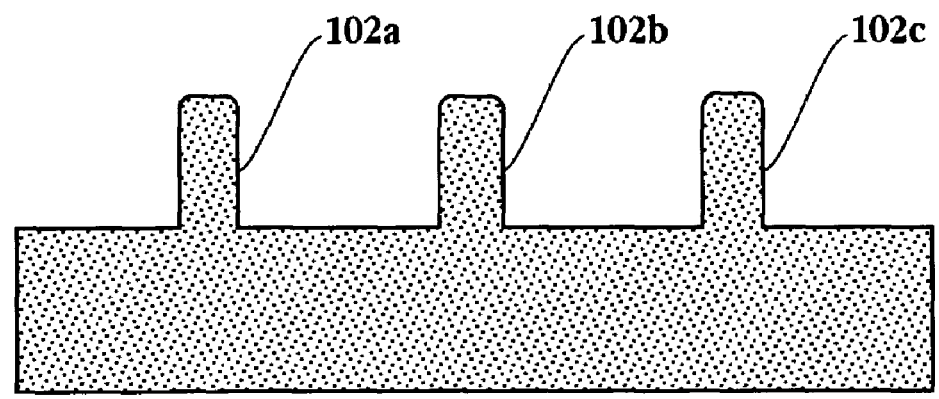
FIG. 9B is a photomicrograph of an etched gate feature with CD control.

FIG. 9B is an exemplary photomicrograph of an etched gate feature with critical dimension control obtained by adding a silicon containing gas to the over-etch process in accordance with one embodiment of the invention. Silicon-containing gas in the silicon etching gas mixture increases the amount of sidewall passivation in order to mitigate any notching. Thus, gate feature 102a through 102c are shown having a notch-free base due to the sidewall passivation provided by the addition of silicon-etching gas. In one embodiment, with respect to hard mask gate applications, the sidewall passivation mainly consists of a Si, O, X-based material with X being a halogen or a mixture of halogens, e.g., bromine, chlorine, fluorine, etc. One skilled in the art will appreciate that the halogen may be dependent on the etch chemistry. Here, the first two etch steps incorporate silicon into the passivation layer from the substrate through reactions involving etch byproducts. However, at the end of the polysilicon etch, during the over-etch step, the silicon-based byproducts are depleted due to the depletion of silicon material to be etched. At the same time, the etching species concentration is increased. As a result, little passivation is created during the over-etch step and the existing passivation at the base of the line can be attacked by the etching species resulting in notching of the polysilicon line. However, the addition of silicon during the over-etch step will replace the depleted silicon previously supplied by the silicon material being etched.

Figure 10:
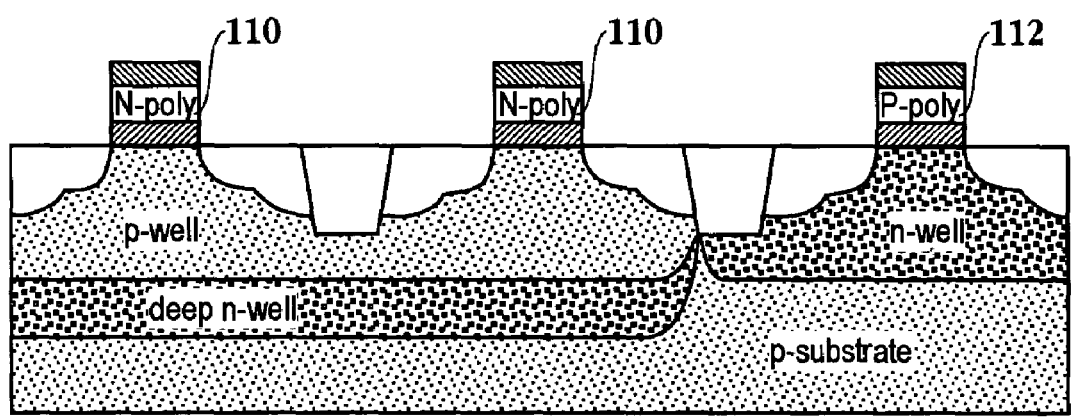
FIG. 10 is a simplified cross sectional schematic diagram illustrating a dual doped gate structure that has been etched with a silicon containing gas utilized to mitigate etch rate differences caused by the dissimilar doping regions.

FIG. 10 is a simplified cross sectional schematic diagram illustrating an etched dual doped gate structure. Here, gates 110 are composed of n-doped polysilicon, while gate 112 is composed on p-doped polysilicon. It should be appreciated that adding a silicon containing gas during the entire etch process enhances the formation of a passivation layer, thereby mitigating differences caused by the dissimilar doped gate structures on the substrate. The amount of the lateral attack can also vary with the doping type during the last steps of the gate-etch process when the etch chemistry becomes more selective to the gate oxide. Consequently, the profiles defined in the first step of the silicon etch may be altered in the final steps, leading to profile and critical dimension differences between the various doped regions, i.e., also referred to as n/p profile loading. Thus, in another embodiment, the addition of a source of silicon on a gas mixture in the last steps of the etch, e.g., the over-etch step, decreases the etch rate micro-loading between different types of doped silicon. In addition, the silicon gas adds more passivation to the lines, thereby reducing the impact of the lateral etch differences between the various types of doped silicon on the profile definition.

Accordingly, adding a silicon-containing gas in the etch gas mixture during the silicon etch will eliminate the notching at the base of the features. Additionally, the silicon-containing gas in the etch-gas mixture during the over etch step will increase the selectivity to oxide. Furthermore, a silicon-containing gas in the etch gas mixture during the silicon etch will reduce the profile differences between the various type of doped silicon present on the same substrate. That is, adding a silicon-containing gas in the etch gas mixture during the silicon etch will reduce the critical dimension bias differences between n-doped, p-doped or undoped lines.

Figure 11:
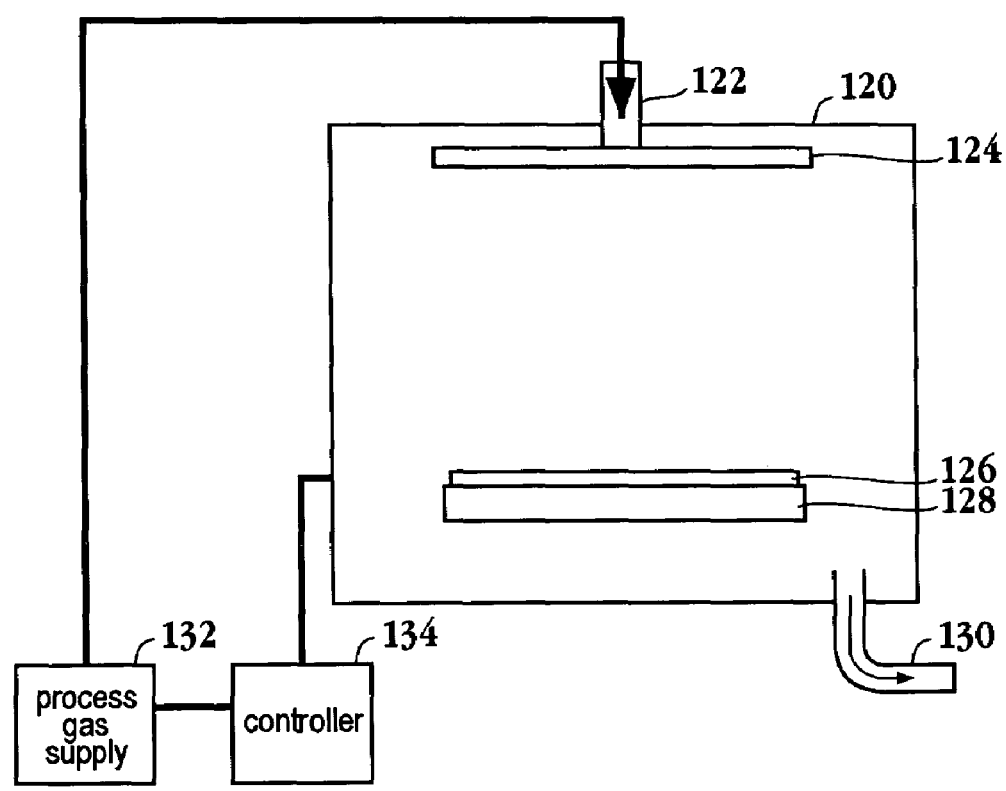
FIG. 11 is a simplified schematic diagram of an etch chamber configured to provide a silicon containing gas during an over etch process.

FIG. 11 is a simplified schematic diagram of an etch chamber configured to provide a silicon containing gas during an over etch process. Etch chamber 120 includes gas inlet 122, top electrode 124, electrostatic chuck 128 supporting wafer or semiconductor substrate 126. Etch chamber 120 also includes outlet 130 which may be in flow communication with a pump for evacuating the etch chamber. Process gas supply 132 is in flow communication with gas inlet 122. It should be appreciated that a passivation enhancing gas, e.g., a silicon containing gas as mentioned above, may be provided to the chamber through gas inlet 122. Controller 134, which is in communication with chamber 120 and process gas supply 134, may be configured to detect a passivation starved condition, i.e., an over etch process. In response to detecting the passivation starved condition, the controller may trigger process gas supply 134 to supply a silicon containing gas to chamber 120. It should be appreciated that controller 134 may detect the passivation starved condition through any suitable endpoint detection or the start of the over etch process may trigger the supply of the silicon containing gas. Furthermore, controller 134 is a general purpose computer in one embodiment.

The parameters associated with the introduction of the silicon containing gas, e.g., $SiCl_4$ are summarized in TABLE 1.

TABLE 1

| Pressure | 0.5-200 mTorr |
|---|---|
| Power | 10-5000 W |
| $SiCl_4$ flow | 0.1-300 sccm |
| Temperature | −77 C. to 200 C. |

It should be appreciated that TABLE 1 is exemplary and not meant to be limiting. That is, any suitable silicon containing gas may be used. Furthermore, depending on the chamber configuration, the range of parameters may vary.

In one embodiment, when SiCl$_4$ or another suitable Si containing gas is added to the gas mixture in the over etch step, the polysilicon is still etched, however, a protective deposition takes place on the gate oxide. That is, a thin layer of SiO$_x$, which may incorporate Br or Cl or any other suitable element present in the chamber, is deposited on the gate oxide or nitridized gate oxide. It should be appreciated that a source of oxygen is also provided to form the SiO$_x$ layer. The oxygen source for the thin layer may originate from the introduction of an oxygen containing gas or the presence of an oxygen containing component in the vessel, e.g., quartz, alumina, an oxygen containing component of the substrate being etched, etc. It should be appreciated that the etch rate selectivity between polysilicon and oxide becomes infinite, i.e., there is no etching of the gate oxide, as a result of the deposition of the thin silicon containing oxide layer. Consequently, this results in improved gate integrity, i.e., minimal if any oxide loss, less silicon recess and significantly reduces the chances of pitting. Furthermore, the increased etch rate selectivity widens the process window since the process may operate in a region where pitting would otherwise occur without the improved selectivity.

In another embodiment, a solid source of silicon may be included in the chamber in order to provide the silicon for the passivation layer. That is, during an over etch process where the silicon being etched is substantially depleted, the solid source of silicon provides the silicon required for the passivation layer in order to prevent notching. For example, a top electrode of the etching chamber may include the solid silicon source, which may be triggered during the over etch step by applying a radio frequency (RF) bias to the top electrode.

Table 2 illustrates the processing parameters associated with an etching chamber in order to achieve the embodiments described herein with reference to anisotropic etching conditions for etching a bilayer resist. It should be appreciated that Table 2 is exemplary and not meant to be limiting. The parameters listed in Table 2 were employed with the use of a Versys 2300 etching machine available from the assignee. Of course, the ranges listed in Table 2 may vary according to the type of machine performing the etch operation.

TABLE 2

| | |
|---|---|
| Pressure | 0.5-200 mTorr |
| Top Power | 10-5000 W |
| Bottom power | 200-300 V$_{pk}$ |
| Temperature | 20 C. to 70 C. |
| SiCl$_4$ flow | 0.1-6 sccm |
| O$_2$ flow | 100-200 |
| N$_2$ flow | 50-200 sccm |
| Cl$_2$ flow | 10-50 sccm |
| HBr flow | 50-100 sccm |

With respect to the gases employed during the bilayer resist etch, one suitable combination includes the use of oxygen (O$_2$), nitrogen (N$_2$), SiCl$_4$, Hydrogen Bromide (HBr), and chlorine (Cl$_2$). A range for the flow rate of oxygen is approximately 100-200 standard cubic centimeters per minute (sccm). Here, oxygen is used as the etchant. The flow rate of nitrogen during the processing is between about 50 and 200 sccm. It should be appreciated that nitrogen assists with maintaining consistency across the substrate surface. An exemplary flow rate for hydrogen bromide is between about 50 and 100 sccm. The hydrogen bromide is used for sidewall passivation. The chlorine flow rate is between about 10 and 50 sccm. In one embodiment, the chlorine flow rate is approximately 10% of the oxygen flow rate. That is, the ratio of the oxygen flow rate to the chlorine flow rate is 10:1. Chlorine is employed to help remove volatile gases. The SiCl$_4$ flow rate is between 0.1 and 6 sccm. The SiCl$_4$ gas is used to help maintain CD in accordance with the embodiments described herein.

Other settings used during the bilayer resist etch include a pressure range between about 3 and 15 milliTorr (mTorr). The power to an upper electrode is between about 300 to 1000 watts, while the peak power available to a bottom electrode is between about 200 and 300 volts. The chamber temperature is between about 20 to 70 degrees Celsius as shown in Table 2. In one embodiment, the plasma density is maintained between $1\times10^9$ per cubic centimeter and $1\times10^{12}$ per cubic centimeter. The settings of pressure and top power illustrated in Table 2 define this plasma density. Ion energy is maintained between about 150 and about 400 volts, where the ion energy is a function of the RF peak power supplied to the bottom electrode.

Figure 12:
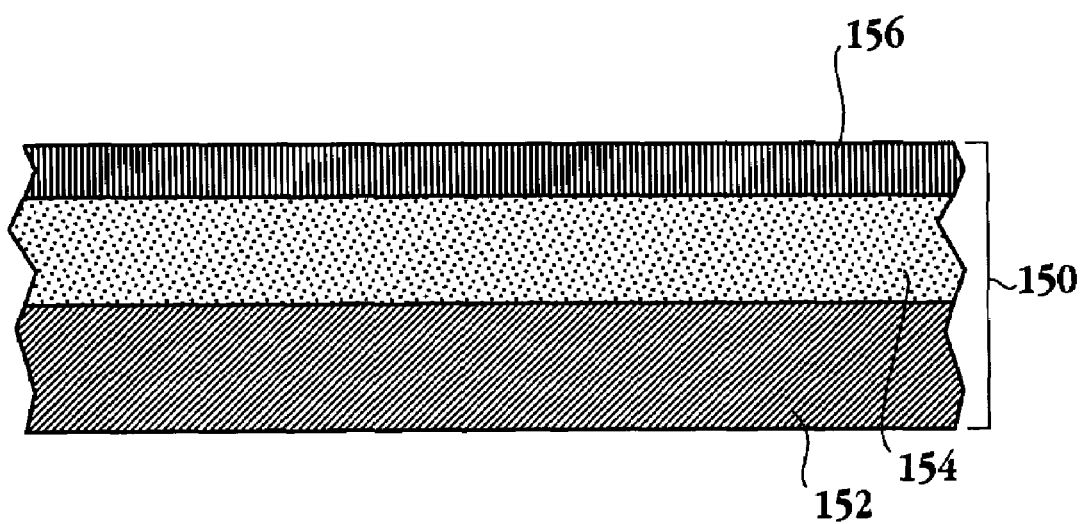
FIG. 12 is a simplified schematic diagram illustrating the various layers of a bilayer resist disposed over a substrate.

FIG. 12 is a simplified schematic diagram illustrating the various layers of a bilayer resist disposed over a substrate. Here, wafer 150 includes polysilicon layer 152, bottom photoresist layer 154 and top photoresist layer 156. Top photoresist layer 156 is subsequently patterned and developed. Thereafter, the bilayer photoresist, which consists of first photoresist layer 154 and second photoresist layer 156, is etched to define a pattern. Typically, top photoresist layer 156 includes silicon, while bottom photoresist layer is an organic photoresist.

Figure 13A:
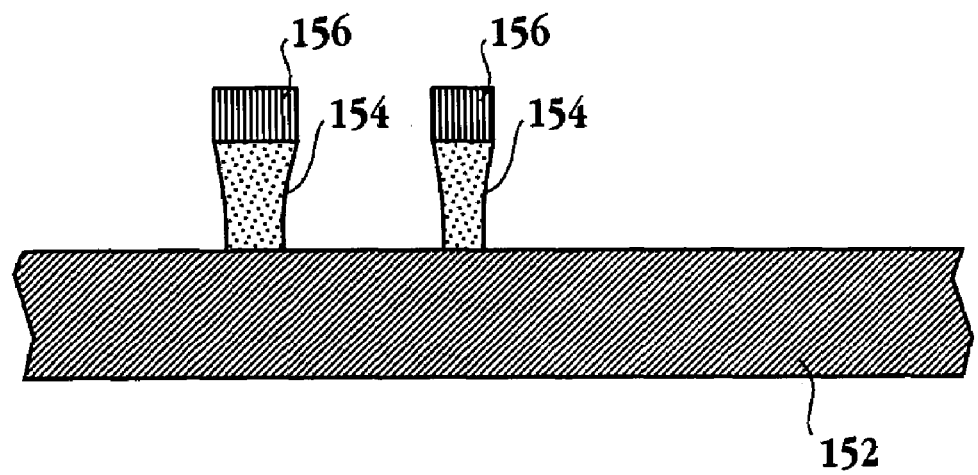
FIG. 13A illustrates notching and undercutting occurring in the lower photoresist layer as a result of the use of silicon dioxide during the etching operation.
Figure 13B:
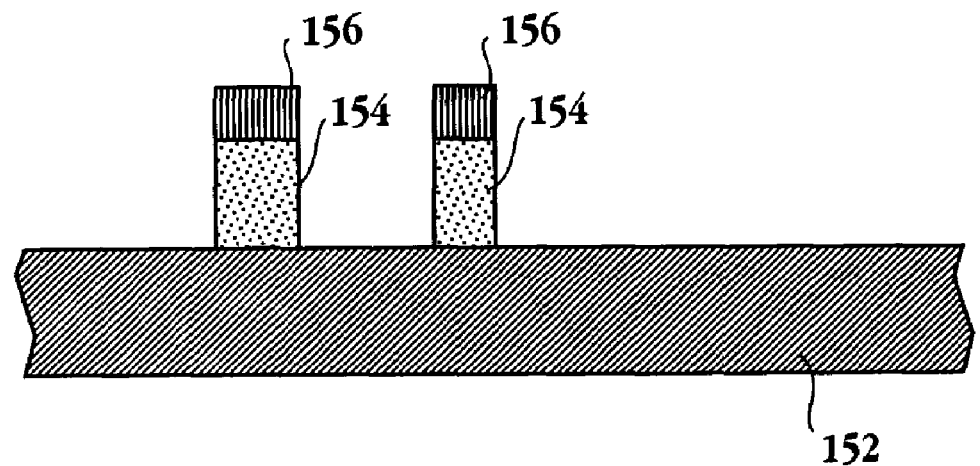
FIG. 13B illustrates the elimination of the undercutting and notching with the employment of $SiCl_4$ gas introduced during the etch operation in accordance with one embodiment of the invention.

FIGS. 13A and 13B illustrate a pattern defined through an etch of the bilayer photoresist when using standard polysilicon chemistry and SiCl$_4$ gases, respectively. FIG. 13A illustrates notching and undercutting occurring in the bottom photoresist layer 154 as a result of conventional chemistry during the etching operation. As shown in FIG. 13A there is a loss of the critical dimension defined between the etched bottom photoresist layers 154 due to the notching and undercutting, which in turn will impact the subsequent etching of polysilicon layer 152. However, FIG. 13B illustrates the elimination of the undercutting and notching with the utilization of SiCl$_4$ gas introduced during the etch operation. Here, the etching of bottom photoresist layer 154 and top photoresist layer 156 results in an etch operation that does not lose CD.

Figure 14A:
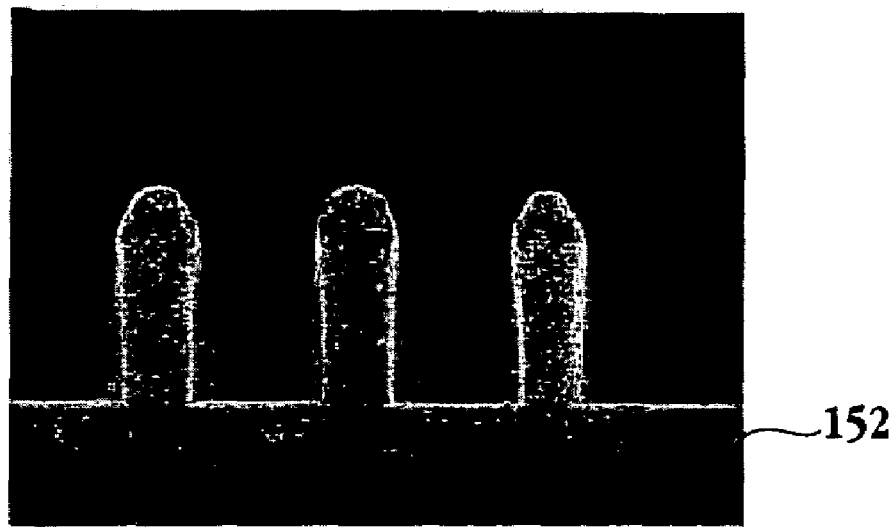
FIGS. 14A and 14B illustrate micrographs corresponding to FIGS. 13A and 13B illustrating the effectiveness of the use of $SiCl_4$ gas as compared to $SO_2$ in accordance with one embodiment of the invention.
Figure 14B:
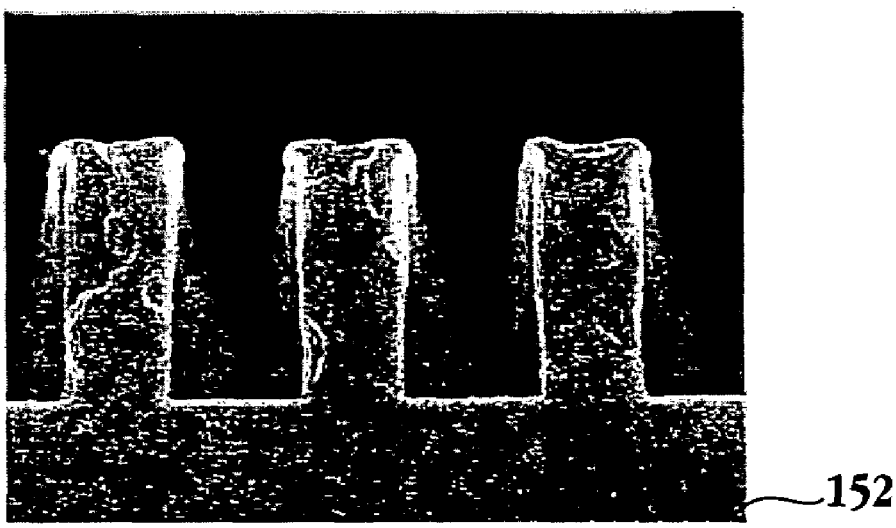

FIGS. 14A and 14B illustrate actual micrographs corresponding to FIGS. 13A and 13B illustrating the effectiveness of the use of SiCl$_4$ gas in accordance with one embodiment of the invention. As shown in FIG. 14B, the loss of CD is minimal as compared to FIG. 14A. FIG. 14A was the result of using standard polysilicon chemistry (HBr, O$_2$, N$_2$) during the etch operation. FIG. 14B utilized Cl$_2$, HBr, O$_2$, N$_2$, and SiCl$_4$ gases for the etch operation. It should be appreciated that the SiCl$_4$ forms SiO$_2$ with the O$_2$ during the etch operation in order to minimize the loss of CD.

Figure 15:
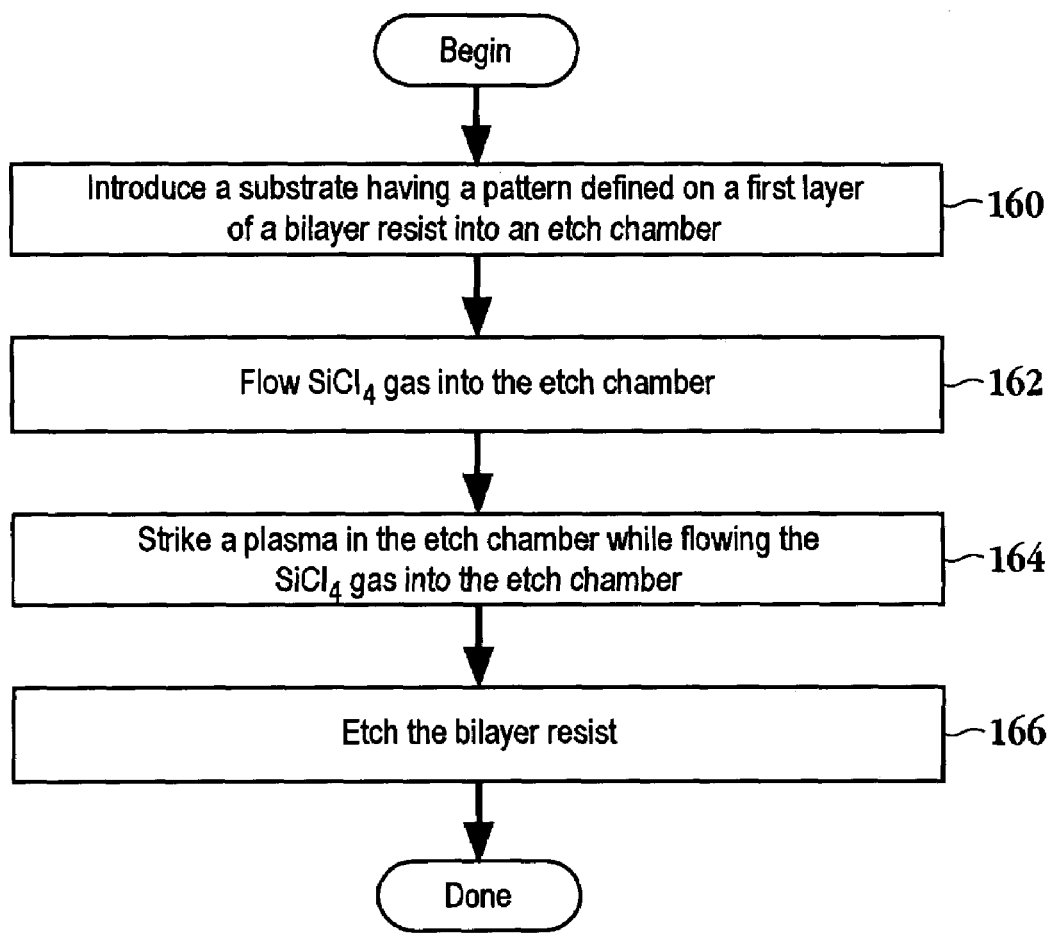
FIG. 15 is a flow chart diagram illustrating the method for etching a bilayer resist defined over a substrate in a plasma etch chamber in accordance with one embodiment of the invention.

FIG. 15 is a flow chart diagram illustrating the method for etching a bilayer resist defined over a substrate in a plasma etch chamber in accordance with one embodiment of the invention. The method initiates with operation 160 where a substrate having a pattern defined on a first layer of a bilayer photoresist is introduced into an etch chamber. The method then advances to operation 162 where SiCl$_4$ gas flows into the etch chamber, along with the mixture of gases listed in Table 2. As described with reference to Table 2 the flow rate of the SiCl$_4$ gas is between 0.1 and 6 SCCM in one embodiment. The method then proceeds to operation 164 where an oxygen based plasma is struck in the etch chamber while flowing the SiCl$_4$ gas into the chamber. Here, the gases listed with reference to Table 2 flow into the chamber along with the SiCl$_4$ gas. In one embodiment, a plasma density of between about 1×10$^9$ per cubic centimeter and 1×10$^{12}$ per cubic centimeter is maintained in the etch chamber. In another embodiment, an ion energy of between about 150 volts and about 400 volts is maintained in the etch chamber. The method then moves to operation 166 where the bilayer resist is etched according to the conditions described herein.

Figure 16A:
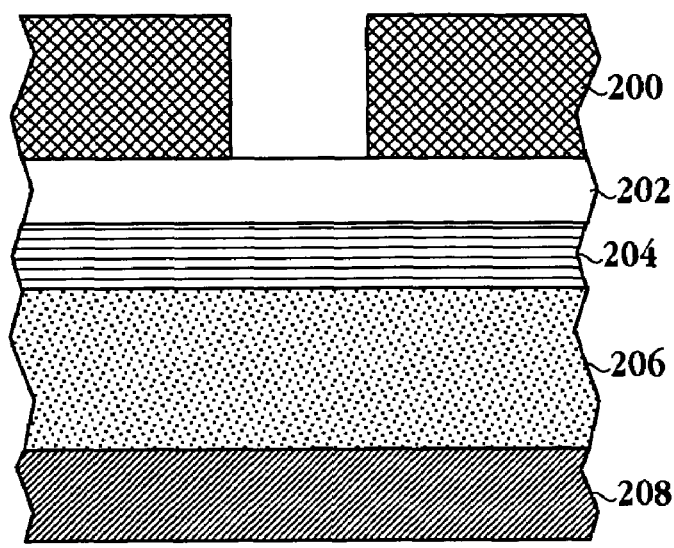
FIG. 16A is a simplified schematic diagram illustrating the various layers for a substrate that undergoes a multi-layer photoresist etch in accordance with one embodiment of the invention.

FIG. 16A is a simplified schematic diagram illustrating the various layers for a substrate that undergoes a multi-layer photoresist etch in accordance with one embodiment of the invention. Photoresist layer 200 is disposed over bottom anti-reflective coating layer 202. Photoresist layer 200 may be developed by known techniques in this embodiment. Bottom anti-reflective coating (BARC) layer 202 is disposed over cap dielectric layer 204 which is disposed on underlayer photoresist (ULPR) 206, which in turn is disposed over layer 208. In one embodiment, photoresist layer 200 has a thickness between about 1200-2000 angstroms. Bottom anti-reflective coating (BARC) layer 202 has a thickness between about 600-1000 angstroms. Cap dielectric layer 204 has a thickness between about 200-400 angstroms, and ULPR 206 has a thickness between about 2000-3000 angstroms in one embodiment. In another embodiment, where ULPR 206 is composed of amorphous carbon, such as an advanced patterning film (APF) available from APPLIED MATERIALS or an ashable hard mask (AHM) available from NOVELLUS, the thickness of ULPR layer 206 is between about 600-1200 angstroms. One skilled in the art will appreciate that photoresist layer 200 may be any suitable photoresist layer such as a 193 nanometer photoresist. As is generally known, BARC layer 202 is used to enhance control of critical dimensions by suppressing standard wave effects and reflective notching caused by thin film interference. It should be noted that BARC layer 202 is optional and may or may not be included depending on the composition of cap dielectric layer 204 and/or the preferences of the entity controlling the etch process. Cap dielectric layer 204 in one exemplary embodiment may be a silicon oxy nitride layer, e.g., SiON. Alternatively, cap dielectric layer 204 may be a silicon oxide layer having a formula SiO$_x$, where x is an integer greater than or equal to one.

Figure 16B:
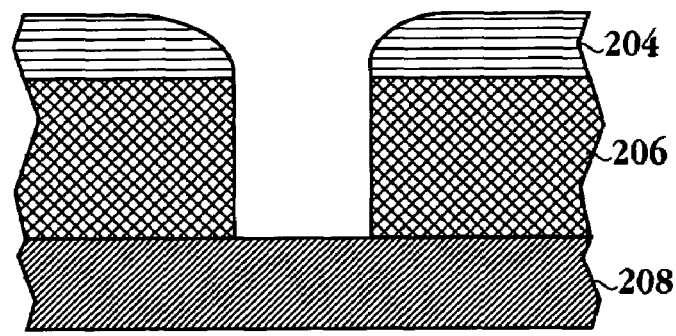
FIG. 16B is a simplified schematic diagram illustrating the etched layers of FIG. 16A.

FIG. 16B is a simplified schematic diagram illustrating the etched layers of FIG. 16A. In one embodiment, a recipe using the processing parameters of Table 3 is applied in order to obtain the results illustrated in FIG. 16B. As illustrated, layers 200 and 202 of FIG. 16A have been removed from the etch operation. The echant material for the embodiments of FIGS. 16A and 16B may be any of the common fluorine based echants such as CF$_4$, CHF$_3$ or CH$_2$F$_2$. In addition, the plasma may be an oxygen based plasma for the embodiments of FIGS. 16A and 16B. Thus, the same echant and plasma may be used to etch the layers illustrated from FIGS. 16A to 16B It will be apparent to one skilled in the art that an amorphous carbon wafer typically includes the cap dielectric, whereas an ULPR other than amorphous carbon often includes the silicon-containing BARC. Thus, SiCl$_4$ or SO$_2$ may be used in these instances for the entire etch operation as discussed below. Table 3 provides further details on exemplary recipes and the corresponding components and settings. As mentioned above with reference to FIG. 16A, BARC layer 202 is optional in one embodiment.

Figure 17A:
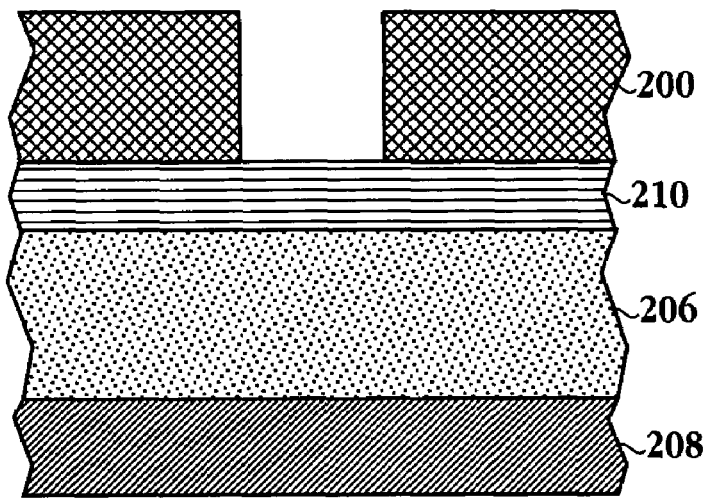
FIG. 17A is a simplified schematic diagram illustrating alternative layers for the multi-layer photoresist from FIG. 16A in accordance with one embodiment of the invention.
Figure 17B:
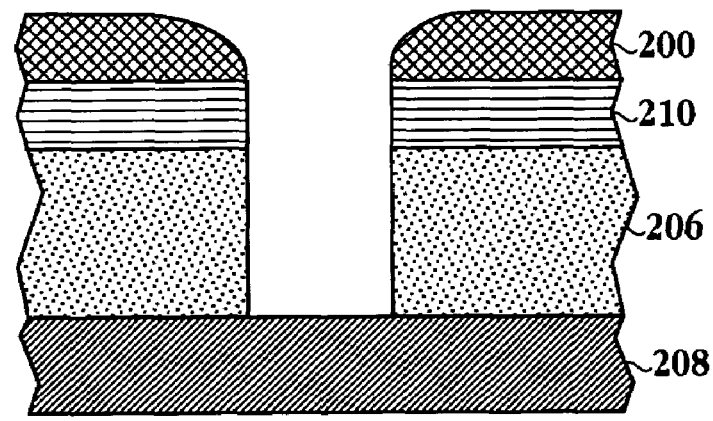
FIG. 17B is a simplified schematic diagram illustrating the etched layers of FIG. 17A.

FIG. 17A is a simplified schematic diagram illustrating alternative layers for the multi-layer photoresist from FIG. 16A in accordance with one embodiment of the invention. In FIG. 17A, photoresist 200 is developed over silicon containing BARC layer 210. Silicon containing BARC layer 210 is disposed over ULPR layer 206. One skilled in the art will appreciate that silicon containing BARC layer 210 may be composed of a combination of silicon, oxygen and carbon elements. It should be noted that the thickness of the common layers between FIGS. 16A and 17A is similar. The thickness of silicon containing BARC layer 210 is between about 600-900 angstroms in one embodiment. It should be further appreciated that the etch performed for FIG. 17A, in order to achieve the etch profile depicted in FIG. 17B, may use a somewhat different recipe than the etch discussed above with regard to FIG. 16A. In FIG. 17A, the echant for top photoresist layer 200 may be similar to the echant used as described with regard to FIG. 16A, i.e., a fluorine based etchant. However, with regard to the remaining layers in FIG. 17A a silicon chloride, also known as tetrachlorosilane (SiCl$_4$)/oxygen based echant may be used thereafter. For example, one such echant recipe may include SiCl$_4$/O$_2$/He/HBr/Cl$_2$. In an alternative embodiment, sulphur dioxide (SO$_2$) may be used to replace the SiCl$_4$. The use of the silicon chloride or sulphur dioxide assists in passivating the silicon containing BARC layer 210 and the ULPR layer 206, in order to ensure a proper etch. Of course, the SiCl$_4$ or SO$_2$ etchants described herein may be used for the layers discussed with regard to FIGS. 16A and 16B in place of the fluorine based etchants.

Figure 18:
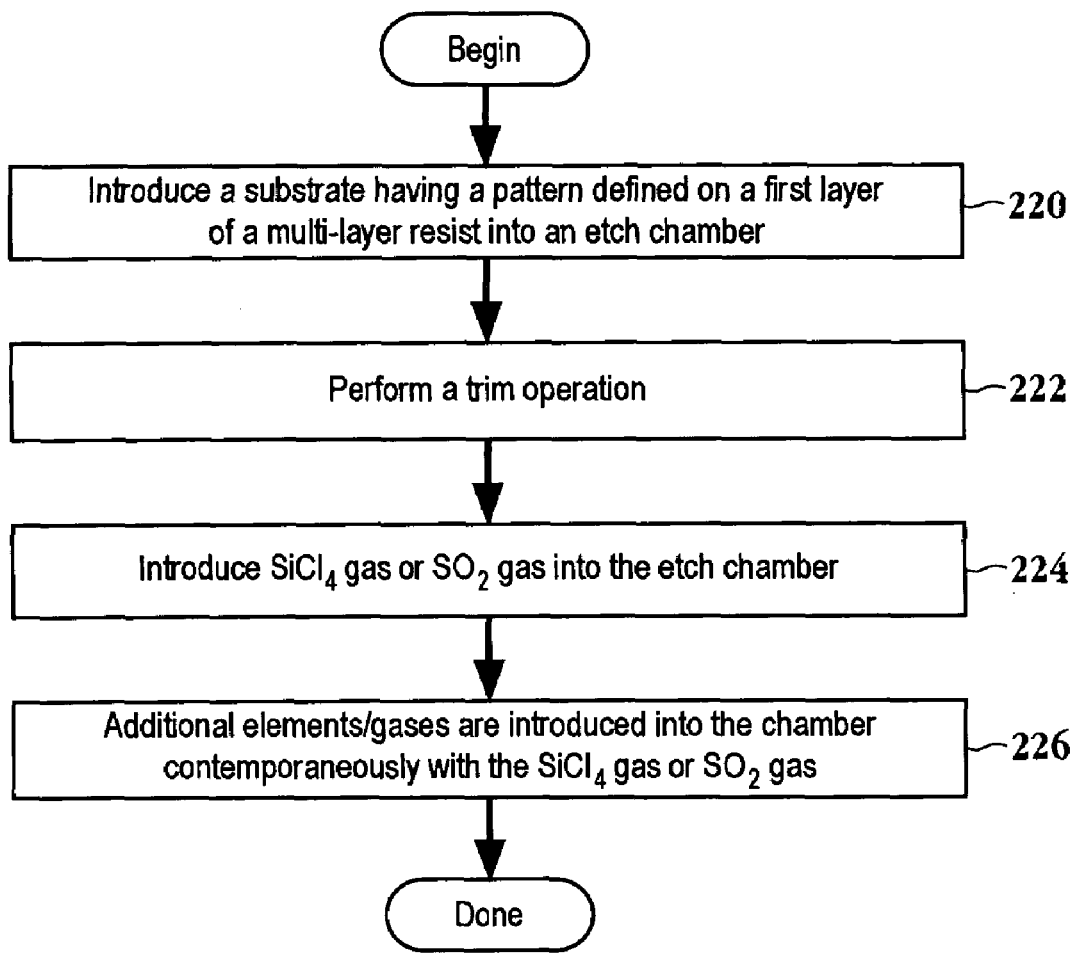
FIG. 18 is a flow chart diagram illustrating the method operations for the etching substrate having a multi-layer photoresist in accordance with one embodiment of the invention.

FIG. 18 is a flow chart diagram illustrating the method operations for the etching substrate having a multi-layer photoresist in accordance with one embodiment of the invention. The method initiates with operation 220 where a substrate having a pattern defined on a first layer of a multi-layer resist is introduced into an etch chamber. The method advances to operation 222 where a trim operation is performed. As mentioned above, the trim operation may laterally etch some of the top layer of a multi-layer resist as per the settings in TABLE 3. In one embodiment, the trim operation could come after the BARC layer is opened. In another embodiment, a hardmask trim, i.e., which is a photoresist trim that trims the hardmask is also performed. The method then proceeds to operation 224 where SiCl$_4$ gas or SO$_2$ gas is introduced into the etch chamber. A plasma is generated and the etch is performed through a BARC layer of the substrate, in which SiCl$_4$ and SO$_2$ may be used for the BARC etch. Of course, fluorine based etchants may also be used for the BARC etch. In one embodiment, the plasma is an oxygen-based plasma. The method then proceeds to operation 226 where additional elements/gases may be introduced, i.e., helium, hydrogen bromide, chlorine, nitrogen, and/or argon gas, etc., in order to perform the etch through the various layers illustrated in FIGS. 16A-17B. It should be appreciated that when using the SO$_2$ gas, a passivation layer having a composition of C$_x$S$_y$, where x and y are non-zero integers, builds up on the sidewall of the feature being etched. When using SiCl$_4$ gas, an SiO$_x$ or an SiO$_x$Cl$_2$ (or SiO$_x$Br$_y$) passivation layer, where x and y are integers, may form on the sidewalls of the feature being etched to prevent lateral etching from occurring. In one embodiment, SiCl$_4$ gas is used as the etchant when the multi-layer photoresist includes a cap dielectric layer, e.g., the embodiments of FIGS. 16A and 16B. In another embodiment, SO$_2$ gas may be used with the multi-layer photoresist with or without the cap dielectric layer, e.g., the embodiments represented in any of FIGS. 16A-17B.

Table 3 provides exemplary process settings for the etching processes mentioned with regard to FIGS. 16A-17B. One skilled in the art will appreciate that the settings may vary depending on the etch chamber being used and the settings provided in Table 3 are exemplary and not meant to be limiting. It should be noted that the exemplary ranges and components may be applied to the method discussed with regard to FIG. 18. In addition, various combinations of the settings and components are possible except where explicitly described as not being possible.

The processes/corresponding layers are specified in columns 3-9 of TABLE 3, while column 1 provides the component/setting and column 2 provides the unit of measure for the corresponding component/setting. As illustrated in TABLE 3, a trim process may be initially performed, or at some time other than initially. The trim process is performed to "trim" the width of the photoresist and the settings are provided in column 3. For example, the photoresist may be developed with a thickness that is slightly larger than required due to constraints with the lithography. The trim operation will further reduce the thickness of the mask. In one embodiment, reducing or eliminating the bias power and increasing the oxygen ($O_2$) flow rate will cause in more lateral attack to perform the trim operation. In column 4, the settings for the etching operation of the bottom anti-reflective coating (BARC) is provided. Here, $SO_2$ gas with or without HBr, $Cl_2$, and helium. In one embodiment, $SiCl_4$ may be used in place of $SO_2$. For a silicon containing BARC, the settings are provided in column 5. Here, $SO_2$ is provided at the corresponding flow rate, while the other gases may be optionally provided in this embodiment. The settings for the cap dielectric, e.g., SiON, etch are provided in column 6, where a fluorine based etchant is utilized. In columns 7 and 8, exemplary settings for etching different embodiments of the under layer photoresist (ULPR) are provided. In column 7, the settings include the use of $SO_2$, while $SiCl_4$ is used for the exemplary settings in column 8. In one embodiment, where the ULPR is an amorphous carbon material, the settings are provided in column 9. As mentioned previously, the settings provided in TABLE 3 are exemplary and equipment dependent. However, the combination of the various gases and settings provide the desired results for a multi-layer etch as described herein. In one embodiment, the multi-layer resist etch includes a minimum of three resist layer, as illustrated in FIGS. 16A-17B.

illustrative rather than restrictive, and it should be appreciated that variations may be made in those embodiments by one skilled in the art without departing from the scope of the present invention as defined by the following claims.

The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

What is claimed is:

1. A method for etching a multi-layer resist defined over a substrate in a plasma etch chamber, comprising method operations of:
    introducing the substrate having a pattern defined on a first layer of the multi-layer resist into the etch chamber;
    flowing $SO_2$ gas into the etch chamber;
    striking a plasma in the etch chamber while flowing the $SO_2$ gas;
    flowing chlorine gas into the etch chamber;
    flowing hydrogen bromide gas into the chamber;
    flowing an inert gas into the chamber; and
    etching the multi-layer resist.

2. The method of claim 1, wherein the method operation of flowing $SO_2$ gas into the etch chamber includes,
    flowing the $SO_2$ gas at a flow rate between about 0.1 standard cubic centimeters per minute (sccm) and 200 sccm.

3. The method of claim 1, wherein the inert gas is nitrogen and the multi-layer resist includes at least three resist layers.

4. The method of claim 1, wherein the method operation of striking a plasma in the etch chamber while flowing the $SO_2$ gas includes,
    generating an oxygen based plasma.

5. The method of claim 1, wherein the method operation of striking a plasma in the etch chamber while flowing the $SO_2$ gas includes,
    maintaining a chamber temperature between about 20 degrees Celsius and about 70 degrees Celsius.

TABLE 3

|  | Units | a. Trim | b. BARC | c. Si-BARC | d. DARC | e. ULPR (A) | ULPR (B) | f. A:C |
|---|---|---|---|---|---|---|---|---|
| Pressure | mT | 2-15 | 2-15 | 2-20 | 2-15 | 2-15 | 2-10 | 2-10 |
| TCP power | W | 200-600 | 200-600 | 200-400 | 150-400 | 300-1000 | 300-1000 | 300-600 |
| Bias voltage | V | 0 | 50-350 | 100-350 | 100-400 | 100-400 | 100-400 | 100-300 |
| HBr | sccm | 0-60 | 0-60 | 0-20 | 0-20 |  | 20-50 | 50-200 |
| $Cl_2$ | sccm | 0-40 | 0-20 | 0-20 |  |  | 20-50 |  |
| $O_2$ | sccm | 2-40 | 2-20 | 0-5 | 0-10 | 50-150 | 80-120 | 0-30 |
| He | sccm | 0-100 | 0-60 | 0-60 | 0-100 |  |  |  |
| $SO_2$ | sccm | 0-200 | 20-200 | 20-200 |  | 50-200 |  |  |
| $SiCl_4$ | sccm | 0-6 | 0-4 | 0-4 |  |  | 0-5 |  |
| $CF_4$ | sccm | 25-100 | 25-100 |  | 0-100 |  |  |  |
| $CH_2F_2$ | sccm | 0-10 |  |  | 0-20 |  |  |  |
| $CHF_3$ | sccm | 0-10 |  |  |  |  |  |  |
| $N_2$ | sccm |  |  |  |  |  | 0-50 |  |
| NF3 | sccm |  |  |  | 0-20 |  |  |  |

The foregoing has described the principles, preferred embodiments and modes of operation of the present invention. However, the invention should not be construed as being limited to the particular embodiments discussed. Thus, the above-described embodiments should be regarded as 6. The method of claim 1, wherein the method operation of striking a plasma in the etch chamber while flowing the $SO_2$ gas includes,
    maintaining a plasma density between about $1\times10^9/cm^3$ and about $1\times10^{12}/cm^3$.

7. The method of claim 6, wherein the method operation of maintaining a plasma density between about $1\times10^9/cm^3$ and about $1\times10^{12}/cm^3$ includes, establishing a chamber pressure between about 2 milliTorr and about 20 milliTorr; and setting a power level for a top electrode of the etch chamber between about 200 watts and about 1000 watts.

8. The method of claim 1, wherein the method operation of striking a plasma in the etch chamber while flowing the $SO_2$ gas includes, maintaining an ion energy between about 150 volts and about 400 volts.

9. The method of claim 8, wherein the method operation of maintaining an ion energy between about 150 volts and about 400 volts includes, establishing a radio frequency (RF) peak voltage for a bottom electrode between about 200 volts and 300 volts.

10. In an etch chamber a method for controlling critical dimension bias during a multi-layer resist etch, comprising method operations of:

striking an oxygen based plasma in a chamber while flowing $SO_2$ gas into the chamber, the striking including flowing chlorine gas into the etch chamber;

flowing hydrogen bromide gas into the chamber;

flowing an inert gas into the chamber;

maintaining a plasma density between about $1\times10^9/cm^3$ and about $1\times10^{12}/cm^3$; and etching each layer of the multi-layer resist.

11. The method of claim 10, wherein the method operation of striking an oxygen based plasma in a chamber while flowing $SO_2$ gas into the chamber includes, flowing the $SO_2$ gas into the chamber between a flow rate of about 0.1 standard cubic centimeters per minute (sccm) and 200 sccm.

12. The method of claim 10, wherein the method operation of maintaining a plasma density between about $1\times10^9/cm^3$ and about $1\times10^{12}/cm^3$ includes, maintaining a power level associated with a top electrode between about 300 watts and about 1000 watts.

13. The method of claim 10, further comprising:

maintaining a ratio of a flow rate for oxygen gas into the chamber to a flow rate of the chlorine gas into the chamber at about 10:1.

14. The method of claim 10, wherein a flow rate of the inert gas is between about 50 sccm and about 200 sccm, a flow rate for the HBr gas is between about 50 and about 100 sccm, and a flow rate for the chlorine gas is between about 10 sccm and about 50 sccm.

15. The method of claim 10, wherein the multi-layer resist includes a first layer disposed over a second layer, the first layer being an organic photoresist, the second layer being a silicon containing bottom anti-reflective coating (BARC), the second layer being disposed over a third layer, wherein the third layer is an under layer photoresist (ULPR).

16. The method of claim 10, further comprising:

maintaining an ion energy between about 150 volts and about 400 volts.

17. The method of claim 16, wherein the method operation of maintaining an ion energy between about 150 volts and about 400 volts includes, establishing a radio frequency (RF) peak voltage for a bottom electrode between about 200 volts and 300 volts.

18. A method for etching a multi-layer resist defined over a substrate in a plasma etch chamber, comprising method operations of:

introducing the substrate having a pattern defined on a first layer of the multi-layer resist into the etch chamber;

flowing one of $SiCl_4$ or $SO_2$ gas into the etch chamber;

striking a plasma in the etch chamber while flowing the $SiCl_4$ or $SO_2$ gas;

flowing chlorine gas into the etch chamber;

flowing hydrogen bromide gas into the chamber;

flowing an inert gas into the chamber; and etching the multi-layer resist.

19. The method of claim 18, wherein the method operation of flowing $SiCl_4$ or $SO_2$ gas into the etch chamber includes, flowing the $SO_2$ gas at a flow rate between about 0.1 standard cubic centimeters per minute (sccm) and 200 sccm when $SO_2$ gas is introduced into the etch chamber; and flowing the $SiCl_4$ gas at a flow rate between about 0.1 standard cubic centimeters per minute (sccm) and 200 sccm when $SiCl_4$ gas is introduced into the etch chamber.

* * * * *